United States Patent [19]

Nelson

[11] 4,358,739

[45] Nov. 9, 1982

[54] WIDE-BAND DIRECT-CURRENT COUPLED TRANSISTOR AMPLIFIER

[76] Inventor: David A. Nelson, 3029 Hiawatha Dr., Loveland, Colo. 80537

[21] Appl. No.: 120,138

[22] Filed: Feb. 11, 1980

[51] Int. Cl.³ ............................................. H03F 3/45
[52] U.S. Cl. ....................................... 330/255; 330/85; 330/100; 330/103; 330/259; 330/260; 330/298
[58] Field of Search ................. 330/85, 100, 103, 255, 330/259, 260, 298

[56] References Cited

U.S. PATENT DOCUMENTS 3,036,274 5/1962 Greatbatch .......................... 330/259
3,422,336 1/1969 Hollstein, Jr. ................... 330/103 X
3,745,477 7/1973 Freeborn ........................ 330/255 X
3,868,583 2/1975 Krabbe ................................ 330/259
4,074,334 2/1978 D'Arrigo et al. ............... 330/298 X

OTHER PUBLICATIONS

"75 Watts Without Tim", *Elektronik*, No. 10, Oct. 1977, pp. 14, 15, 16.

*Primary Examiner*—James B. Mullins
*Attorney, Agent, or Firm*—Keith D. Beecher

[57] ABSTRACT

A wide-band direct-current coupled transistor amplifier is provided which exhibits uniform gain in a frequency range from direct-current to greater than 100 MHz, and which exhibits other desirable features.

7 Claims, 5 Drawing Figures

WIDE-BAND DIRECT-CURRENT COUPLED TRANSISTOR AMPLIFIER

BACKGROUND

The amplifier of the invention has the following features: (1) Uniform gain from direct-current to frequencies greater than 100 MHz; (2) High power and low distortion in a direct-current coupled amplifier; (3) Input and output impedances which do not vary as a function of frequency to any material extent from a desired impedance (to be referred to herein as "low VSWR"); (4) A direct-current coupled amplifier having gain with a single pole roll-off and without any tendency to peak so that the amplifier may be used for amplifying pulses; (5) Stable direct-current and alternating-current performance in such an amplifier over a wide temperature range; (6) A direct-current coupled amplifier whose input and output are centered around zero volts D.C.; and (7) A low noise figure.

Prior to the present invention, the only means for achieving all the features listed above was to place an alternating-current coupled high frequency amplifier in parallel with a direct-current coupled low frequency amplifier. Then, the frequency response of each of the two amplifiers was carefully adjusted in an attempt to provide uniform response over a wide frequency range. A low VSWR was then achieved by properly padding the input and the output of each of the two amplifiers and by then summing the two inputs and the two outputs.

The major disadvantages encountered in the prior art arrangement described in the preceding paragraph are the difficulty in obtaining overall uniform response over the frequency range of the two amplifiers, the fact that padding and summing the outputs of the two amplifiers to produce low VSWR attenuates the overall output materially thereby reducing the gain and efficiency of the system, the phase non-linearity of the output of the two amplifiers with respect to the input, the deviations of the performance of most commonly used AC coupled amplifiers as a function of temperature, and the increased noise figure resulting from padding the input.

A significant advantage of the direct-current coupled amplifier of the present invention over the prior art amplifiers described above is that the amplifier of the present invention is a single amplifier which exhibits good direct-current characteristics as well as a good alternating-current response, so that the achievement of improved response and low VSWR, as well as high gain and high efficiency becomes feasible. In addition, the phase relationship of the output of the amplifier of the invention with respect to the input is extremely linear over the major portion of the bandwidth of the amplifier.

DETAILED DESCRIPTION OF THE ILLUSTRATED EMBODIMENTS

Figure 1:
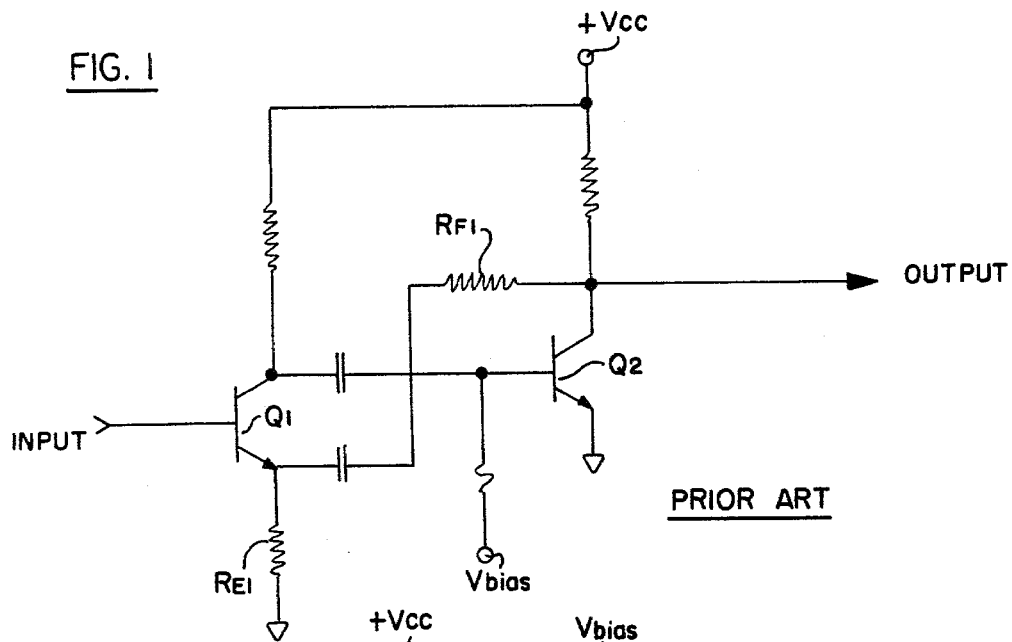
FIGS. 1, 2 and 3 are representations of different prior art basic feedback amplifiers.

The basic feedback amplifier of FIG. 1 is a series-shunt pair formed of two NPN transistors Q1 and Q2 which are inter-coupled through a shunt feedback resistor $R_{F1}$ as shown, the emitter of transistor Q1 being connected to a grounded series feedback resistor $R_{E1}$. The series-shunt pair in the circuit of FIG. 1 has the characteristic of high input impedance, low output impedance, and voltage gain.

Figure 2:
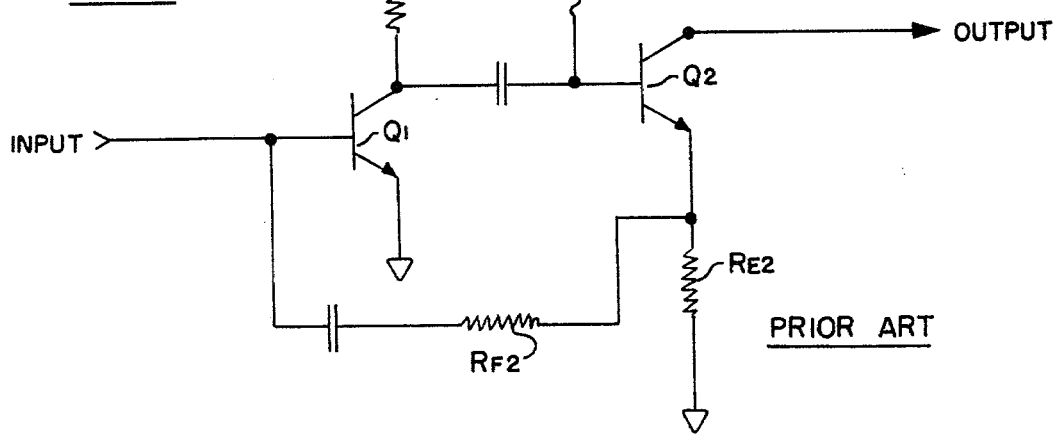

In FIG. 2, the transistors Q1 and Q2 are connected as a shunt-series pair in a second basic feedback amplifier. In the latter circuit, the emitter of the transistor Q2 is connected to a grounded series feedback resistor $R_{E2}$, and the emitter of transistor Q2 is coupled back to the base of transistor Q1 through a shunt feedback resistor $R_{F2}$. The shunt series pair of FIG. 2 has the characteristics of low input impedance, high output impedance, and current gain.

Figure 3:
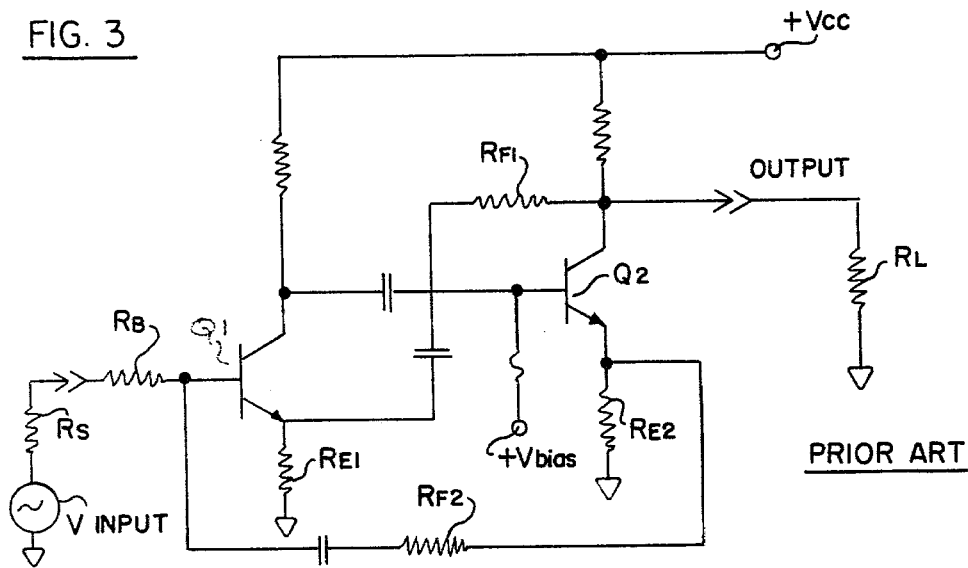

In the circuit of FIG. 3, transistors Q1 and Q2 are connected as a dual series-shunt, shunt-series pair, which is a general configuration of the two feedback pairs of FIGS. 1 and 2, and which constitutes what shall be termed herein a "basic amplifier".

In the circuit of FIG. 3, the collector of transistor Q2 is coupled back to the emitter of transistor Q1 through shunt feedback resistor $R_{F1}$, as in the circuit of FIG. 1; and the emitter of transistor Q2 is coupled back to the base of transistor Q1 through shunt feedback resistor $R_{F2}$, as in the circuit of FIG. 2. Likewise, the emitter of transistor Q1 is connected to grounded series feedback resistor $R_{E1}$ as in the circuit of FIG. 1, and the emitter of transistor Q2 is connected to grounded series feedback resistor $R_{E2}$ as in the case of the circuit of FIG. 2. The output of the circuit of FIG. 3 is connected to an appropriate load represented by a load resistor $R_L$. The input from an appropriate source is introduced through resistors $R_S$ and $R_B$ to the base of transistor Q1.

By adjusting the values of the resistors in the circuit of FIG. 3, the input impedance, the output impedance, and the power gain of the amplifier circuit of FIG. 3 can be controlled, although not independently of one another.

The amplifier of the present invention represents certain modifications of the basic amplifier of FIG. 3 in order to exhibit the features set forth above.

Figure 4:
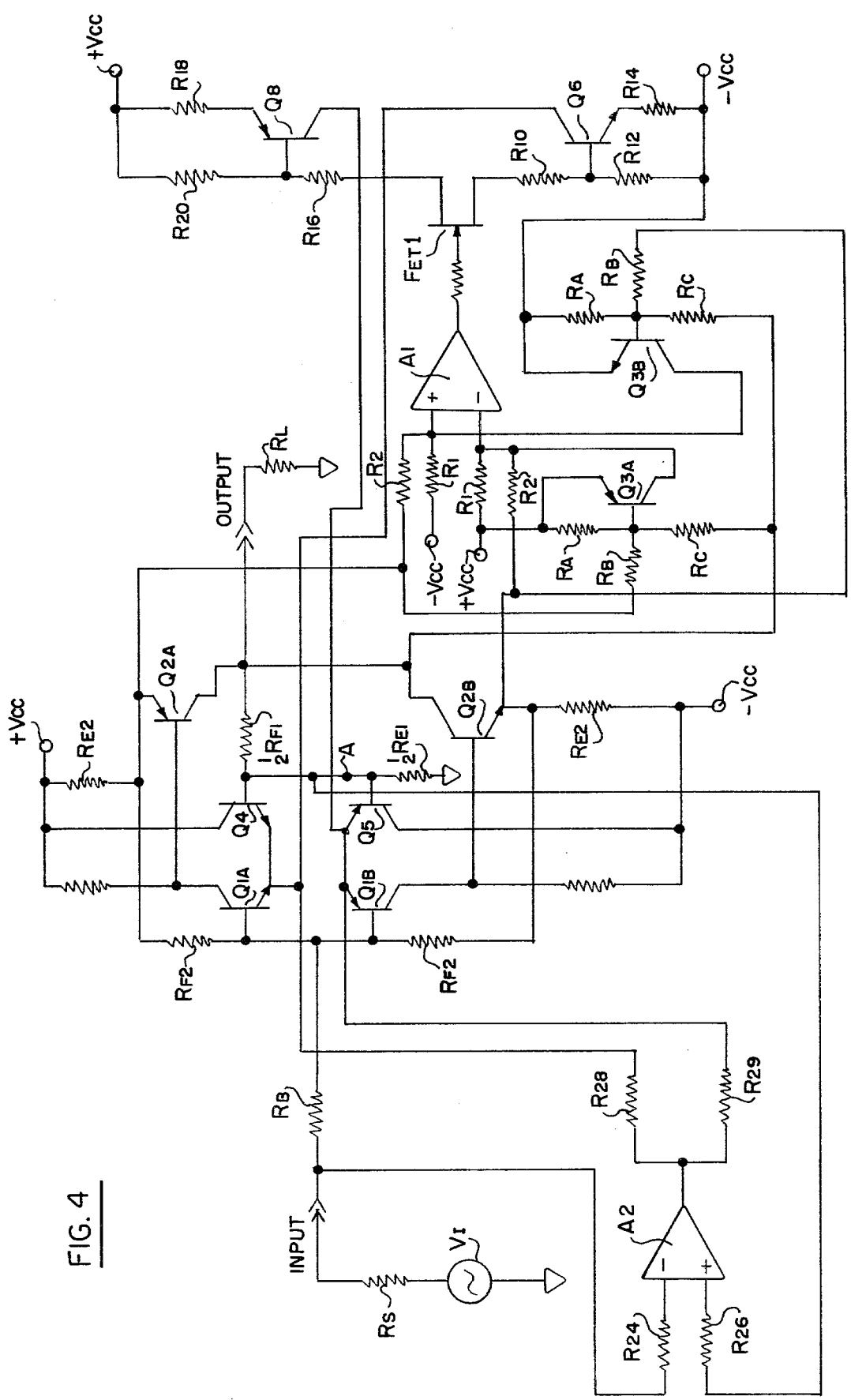
FIG. 4 is a circuit diagram of one embodiment of the wide-band direct-current coupled amplifier of the invention.

In the circuit of FIG. 4, the transistor Q1 of FIGS. 1, 2 and 3 is replaced by a pair of transistors Q1A and Q1B, the transistor Q1A being of the NPN type and transistor Q1B being of the PNP type. Likewise, the transistor Q2 of the circuits of FIGS. 1, 2 and 3 is replaced by a pair of transistors Q2A and Q2B, the transistor Q2B being of the NPN type and transistor Q2A being of the PNP type. The circuit also includes a further NPN transistor Q4 and a further PNP transistor Q5. The collector of the transistor Q2A is connected back to the emitter of transistor Q1A through a feedback circuit which includes a shunt feedback resistor ½ RF1 and transistor Q4, whereas the emitter of transistor Q2B is connected back to the base of transistor Q1B through shunt feedback resistor $R_{F2}$. The emitter of transistor Q1B is connected to grounded series feedback resistor ½ $R_{E1}$ through transistor Q5. The emitter of transistor Q2B is connected to series feedback resistor $R_{E2}$ which, in this case, is connected to the negative terminal of the D.C. source $V_{CC}$.

The circuit thus far described of the amplifier of FIG. 4 is a high frequency amplifier which includes negative feedback, and which has been made symmetrical to reduce even-order harmonic distortion and to reduce variations in direct current performance caused by temperature changes, and to provide for the input and output of the amplifier to be centered about zero volts. However, without further modification in the circuit, temperature change still has an adverse affect on D.C. and A.C. performance of the amplifier. The open loop gain of the high frequency amplifier is the gain from input to output when the resistance of resistor ½ $RE_1$ is zero, and when the resistances of ½ $RF_1$ and $RF_2$ are each infinite.

In order further to reduce bias current variations which lead to direct-current offsets at the input and output of the amplifier, and to distortion, the low frequency open loop gain of the transistors Q1A, Q1B, Q2A and Q2B forming the high frequency amplifier must be increased so that the negative feedback present in the high frequency amplifier can be effective in reducing these variations to the desired level. Since actually increasing the open loop gain of the high frequency amplifier without degrading other desirable features is not possible, two additional circuits have been incorporated into the amplifier of FIG. 4.

The first of the two additional circuits includes an operational amplifier A1. The emitter of transistor Q2A is connected to the positive input of operational amplifier A1 through a resistor R2, and the positive input of the operational amplifier is also connected through a resistor R1 to the negative terminal of the voltage source $V_{CC}$. The emitter of transistor Q2B is connected through a resistor R2 to the negative input of operational amplifier A1, and the negative input of the operational amplifier is also connected through a resistor R1 to the positive terminal of the voltage source $V_{CC}$. The emitter of transistor Q2B is also connected through a resistor $R_B$ to the base of an NPN transistor Q3B, the emitter of which is connected to the negative terminal of source $V_{CC}$. The emitter of transistor Q3B is connected back to the base through a transistor $R_A$, and the base of the transistor is connected through a resistor $R_C$ to the collector of transistor Q2B. The collector of transistor Q3B is connected to the positive input of operational amplifier A1.

The emitter of transistor Q2A is connected through a resistor $R_B$ to the base of a PNP transistor Q3A, the collector of which is connected to the negative input of operational amplifier A1. The emitter of transistor Q3A is connected back to its base through a resistor $R_A$, and the base is connected to the collector of transistor Q2B through a resistor $R_C$.

The output of operational amplifier A1 is connected to the gate electrode of a field effect transistor FET1. The source electrode of the transistor FET1 is connected through resistors R10 and R12 to the negative terminal of the source $V_{CC}$. The junction of resistors R10 and R12 is connected to the base of an NPN transistor Q6, the emitter of which is connected to the negative terminal through a resistor R14. The collector of transistor Q6 is connected to the emitter of transistor Q1A.

The drain electrode of transistor FET1 is connected through a resistor R16 to the base of a PNP transistor Q8. The emitter of transistor Q8 is connected through a resistor R18 to the positive terminal of the source $V_{CC}$, and the base of the transistor is connected to the source through a resistor R20. The collector of transistor Q8 is connected to the emitter of transistor Q1B.

The circuit of the operational amplifier A1, field effect transistor FET1, and transistors Q6 and Q8 constitutes a first high gain low frequency amplifier which effectively increases the gain of the transistors Q1A and Q1B in a manner such that feedback resistors $R_{F2}$ and $R_{E2}$ can now keep the voltage between the emitters of the transistors Q2A and Q2B constant. Thus, the collector currents of the transistors Q2A and Q2B are no longer affected by variations of their base-emitter voltages or of the low gain of the transistors Q1A and Q1B, all of which are affected by temperature.

The circuit of the first high gain low frequency amplifier decreases variations in harmonic and intermodulation distortion which are heavily dependent upon bias currents. The first high gain low frequency amplifier also helps to reduce D.C. offset variations at the input and at the output of the overall amplifier circuit which are caused by differing transistor characteristics from one transistor to another and by temperature changes.

The second of the two additional circuits includes an operational amplifier A2. The junction of resistors $R_S$ and $R_B$ is connected through a resistor R24 to the negative input of amplifier A2, and the base of transistor Q5 is connected through a resistor R26 to the positive input of the amplifier A2. The output of the amplifier A2 is connected through a first resistor R28 to the emitter of transistor Q1A, and through a second resistor R29 to the emitter of transistor Q1B.

The circuit of the operational amplifier A2 constitutes a second high gain low frequency amplifier which effectively increases the open loop gain of the high frequency amplifier formed by transistors Q1A and Q1B in a manner such that feedback resistors ½ $R_{F1}$ and ½ $R_{E1}$ can now keep the voltage between the input and point A close to zero. Now, variations in the characteristics of transistors Q1A, Q1B, Q2A, Q2B from one transistor to another, as well as variations caused by temperature changes do not significantly affect the input or output offset voltages. Low frequency distortion is also decreased because of the additional open-loop gain caused by the circuit of operational amplifier A2. The pulse response of the basic amplifier is also improved because the circuit of operational amplifier A2 decreases the settling time.

The circuit of FIG. 4 satisfies all the requirements for solving the seven basic problems set forth above. The following equations show the dependence of input impedance ($R_I$) and output impedance ($R_O$), and gain ($S_{21}$) upon critical resistor values:

$$R_I = R_B + \left(\frac{R_{F2}}{R_{E2}} + 1\right) \bigg/ \left(\left(\frac{R_{F1}}{R_{E1}} + 1\right) \frac{1}{R_L} + \frac{1}{R_{E1}} + \frac{2}{R_{E2}}\right) \quad (1)$$

$$R_O = \left(\frac{R_{F1}}{R_{E1}} + 1\right) \bigg/ \left(\left(\frac{R_{F2}}{R_{E2}} + 1\right) \frac{1}{R_S + R_B} + 2\left(\frac{1}{R_{E1}} + \frac{1}{R_{E2}} + \frac{1}{R_{E2}}\right)\right) \quad (2)$$

-continued $$S_{21} = \left(\frac{R_I - R_B}{R_I}\right)\left(\frac{R_{F1}}{R_{E1} + r_{eQ1}} + 1\right) \quad (3)$$

Where: $r_{eQ1} = KT/Q_1/I_{CQ1}$

Where $I_{CQ1}$ is the D.C. collector current of Q1.

The circuit of transistors Q3A and Q3B provide a protection circuit for transistors Q2A and Q2B. This circuit senses an overload condition and then alters the bias of the amplifier in order to make it less susceptible to destruction.

The prior art protection circuits include means for limiting the voltage across the protected transistor, or the current through the protected transistor, or means for limiting power dissipation by sensing the transistor temperature. However, in the amplifier of FIG. 4 both current and voltage sensing are required, and to use the prior art concepts would result in excessive circuitry. Also, power dissipation limiting is not appropriate because such circuitry is slow acting due to the thermal time constants involved, since the temperature sensor cannot be placed directly on the transistor silicon wafer.

The circuitry of the transistors Q3A and Q3B provides fast acting power dissipation limiting. Resistor $R_B$ senses the current flowing in transistors Q2A and Q2B; and resistor $R_C$ together with resistor $R_B$ sense the collector voltage of transistors Q2A and Q2B. Resistor $R_A$ also serves as a reference point. Transistors Q3A and Q3B operate as a switch, that is, the transistors remain non-conductive until the power dissipation in transistors Q2A and Q2B exceeds a predetermined limit. When that occurs, the transistors Q3A and Q3B become conductive, and current flows in the circuit causing the voltage between the emitters of the transistors Q2A and Q2B to increase, which reduces the collector current until the power dissipation in the transistors Q2A, Q2B, is less than the predetermined maximum. By proper selecting the ratios of resistors $R_B/R_A$ and $R_C/R_A$ the power dissipation limit can be accurately set for a given $V_{be}$ of transistors Q3A, Q3B. The negative temperature coefficient of $V_{be}$ can be used to advantage. By selecting the value of resistor $R_A$, the power dissipation limit can be made to decrease at higher ambient temperatures or increase at lower ambient temperatures in order that the junction temperature of each of the transistors Q2A and Q2B never exceeds a certain value. Since controlling junction temperature is the actual reason for limiting power dissipation, the circuit is ideal for its intended purpose.

Figure 5:
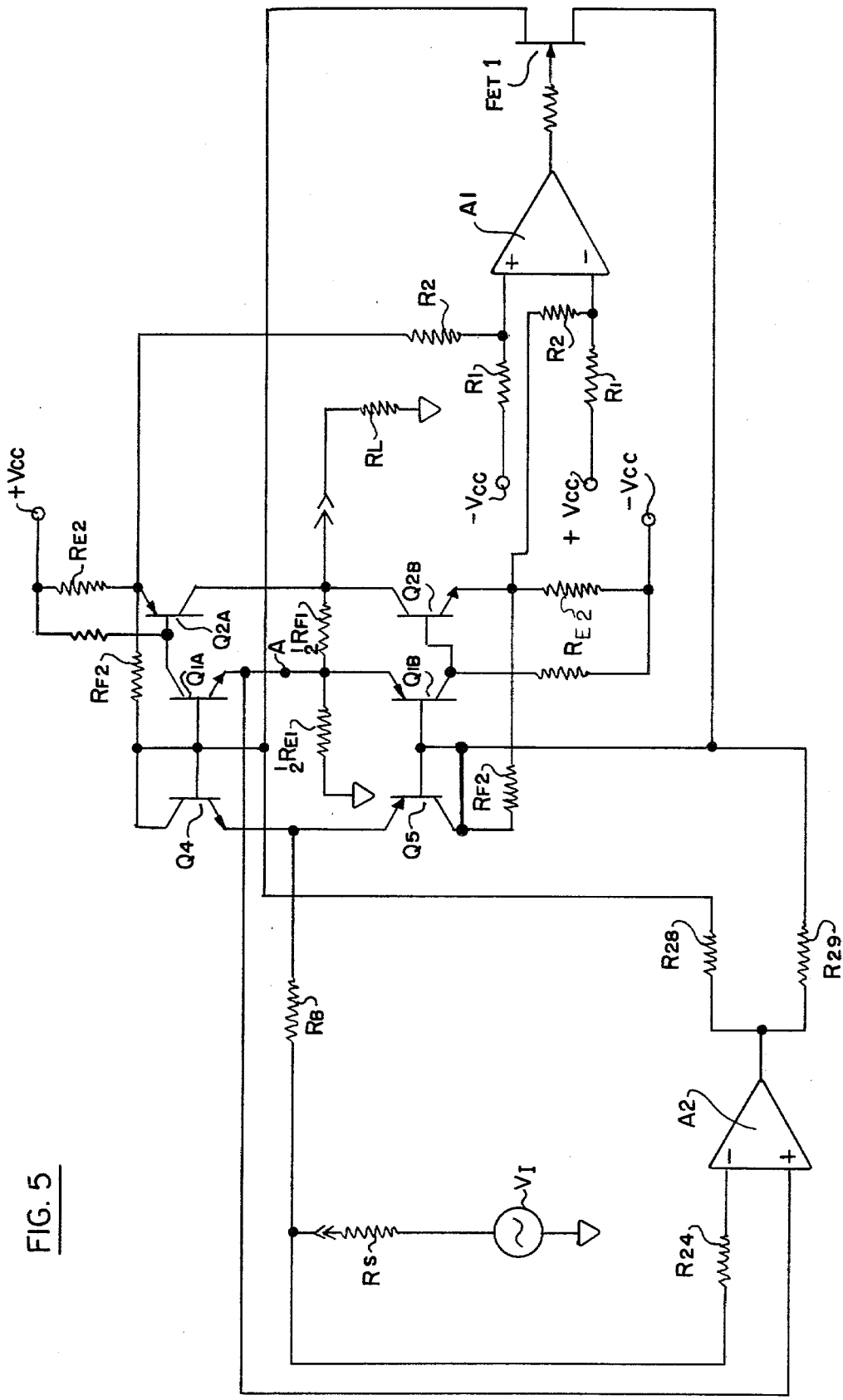
FIG. 5 is a circuit diagram of a second embodiment of the amplifier of the invention.

FIG. 5 represents a slightly different configuration of the circuit of FIG. 4, and like elements have been designated by the same reference numbers. The circuit of FIG. 5 operates in the same manner as the circuit of FIG. 4.

Although two embodiments of the amplifier of the invention have been shown and described, it is evident that many other variations are possible. The concept of the invention involves the symmetrical aspects of the amplifier when used in conjunction with a circuit which acts to keep the emitters of the transistors Q2A and Q2B separated by a constant voltage, and/or circuitry which acts to maintain the input and point A in the amplifier at the same voltage, both of these latter circuits serving to supplement the low frequency loop gain.

Accordingly, although various embodiments of the invention have been shown and described, modifications may be made, and it is intended in the following claims to cover all modifications which come within the true spirit and scope of the invention.

What is claimed is:

1. A wide-band direct-current coupled amplifier comprising: a high-frequency negative-feedback symmetrical amplifier including a first pair of transistors (Q1A, Q1B) and a second pair of transistors (Q2A, Q2B), each having emitter, collector and base electrodes, and further including series-shunt and shunt-series negative feedback circuitry interconnecting the electrodes of said transistors; and a high-gain low-frequency amplifier (A1) connected to two of the electrodes of the transistors of the first pair (Q1A, Q1B) to increase the gain of the transistors of the first pair at low frequencies so that the feedback circuitry maintains the voltage between two of the electrodes of the second pair (Q2A, Q2B) constant.

2. The wide-band direct-current coupled amplifier defined in claim 1, in which said high-gain low-frequency amplifier is connected to the emitter electrodes of the transistors of the first pair (Q1A, Q1B) so as to maintain constant voltage between the emitter electrodes of the transistors of the second pair (Q2A, Q2B).

3. The wide-band direct-current coupled amplifier defined in claim 1, in which said high-gain low-frequency amplifier is connected to the base electrodes of the transistors of the first pair (Q1A, Q1B) so as to maintain constant voltage between the emitter electrodes of the transistors of the second pair (Q2A, Q2B).

4. The wide-band direct-current coupled amplifier defined in claim 1, in which said high frequency amplifier includes a further pair of transistors (Q4, Q5), each having emitter, collector and base electrodes interconnected with the electrodes of the transistors of the first and second pairs, and which includes a second high-gain low-frequency amplifier (A2) connected to two of the electrodes of the transistors of the first paid (Q1A, Q1B) to maintain the voltage of two of the electrodes of the transistors of the further pair (Q4, Q5) substantially at the input voltage of the amplifier.

5. The wide-band direct-current coupled amplifier defined in claim 1, in which said high frequency amplifier includes a further pair of transistors (Q4, Q5), each having emitter, collector and base electrodes interconnected with the electrodes of the transistors of the first and second pairs, and which includes a second high-gain low-frequency amplifier (A2) connected to the emitter electrodes of the transistors of the first paid (Q1A, Q1B) to maintain the voltage at the base electrodes of the transistors of the further pair (Q4, Q5) substantially at the input voltage of the amplifier.

6. The wide-band direct-current coupled amplifier defined in claim 1, in which said high frequency amplifier includes a further pair of transistors (Q4, Q5), each having emitter, collector and base electrodes interconnected with the electrodes of the transistors of the first and second pairs, and which includes a second high-gain low-frequency amplifier (A2) connected to the base electrodes of the transistors of the first pair and of the further pair to maintain the voltage of the emitter electrodes of the first pair (Q1A, Q1B) substantially at the input voltage of the amplifier.

7. The wide-band direct-current coupled amplifier defined in claim 1, and which includes a fast-acting protection circuit connected to the transistors of the first and second pairs for limiting power dissipation therein, said last-named circuit including switching transistor means which becomes conductive when the power dissipation in one of the transistors of the second pair exceeds a predetermined threshold and which serves to reduce the current in the transistors of the first and second pairs upon such an occurence.

* * * * *